(12) United States Patent
Bittrich et al.

(10) Patent No.: US 6,759,140 B2
(45) Date of Patent: Jul. 6, 2004

(54) INJECTION-MOLDED PLASTIC PART

(75) Inventors: Hans-Heiner Bittrich, Meerbusch (DE); Stefan Claus, Mömbris (DE); Frank Krüger, Wölfersheim (DE); Jan Wahode, Freigericht (DE); Volker Zippmann, Linden (DE)

(73) Assignee: W. C. Heraeus GmbH & Co. KG (DE)

(*) Notice: Subject to any disclaimer, the term of this patent is extended or adjusted under 35 U.S.C. 154(b) by 95 days.

(21) Appl. No.: 09/968,367

(22) Filed: Oct. 1, 2001

(65) Prior Publication Data

US 2002/0045058 A1 Apr. 18, 2002

(30) Foreign Application Priority Data

Sep. 29, 2000 (DE) .......................................... 100 48 768
Nov. 1, 2000 (DE) .......................................... 100 54 088

(51) Int. Cl.[7] .......................... B29C 45/00; B28B 5/00; B32B 15/08; B32B 33/00; B32B 27/00
(52) U.S. Cl. ........................ 428/626; 428/457; 428/674; 428/58; 428/687; 428/461; 428/523; 428/614; 439/723; 264/478; 264/297.2; 264/328.1; 264/328.8
(58) Field of Search ................................ 428/626, 670, 428/671, 674, 58, 687, 457, 469, 461, 523, 614, 297.4; 264/478, 513, 297.2, 328.1, 328.8; 439/723

(56) References Cited

U.S. PATENT DOCUMENTS

| | | | | |
|---|---|---|---|---|
| 6,027,771 A | * | 2/2000 | Moriya | 428/1 |
| 6,338,009 B1 | * | 5/2002 | Liao et al. | 525/113 |
| 6,414,072 B2 | * | 7/2002 | Murakami et al. | 524/464 |
| 2001/0045361 A1 | * | 11/2001 | Boone | 205/118 |

FOREIGN PATENT DOCUMENTS

| | | |
|---|---|---|
| DE | 44 16 986 | 5/1995 |
| DE | 44 32 966 | 3/1996 |
| EP | 256 428 | 2/1988 |
| EP | 425 294 | 5/1991 |
| JP | 11 207 781 | 8/1999 |

OTHER PUBLICATIONS

Article entitled "LCP selektiv metallisieren" by Wera Leonhard, et al., published in GALVANOTECHNIK, 1999, pp. 20–22, no month.

* cited by examiner

Primary Examiner—Michael La Villa
(74) Attorney, Agent, or Firm—Ostrolenk, Faber, Gerb & Soffen, LLP

(57) ABSTRACT

An injection-molded plastic part having a first thermoplastic component and a second thermoplastic component. Areas consisting of the first thermoplastic component are present at least on one surface of the injection-molded plastic part next to areas of the second thermoplastic component. The first thermoplastic component is an LCP and the second thermoplastic component is a syndiotactic polystyrene.

16 Claims, 3 Drawing Sheets

INJECTION-MOLDED PLASTIC PART

BACKGROUND OF THE INVENTION

The invention pertains to an injection-molded plastic part consisting of a first thermoplastic component and a second thermoplastic component. Areas of the first thermoplastic component are present on a surface of the injection-molded plastic part next to areas of the second thermoplastic component. The first thermoplastic component is an LCP. In addition, the invention also pertains to a process for producing an injection molded part using syndiotactic polystyrene.

DE-OS 4,432,966 A1, which also refers to DE 4,416,986 A1, describes a two-component injection-molding process for the production of injection-molded plastic parts of the general type in question and also describes components of this type. In the process, a molded body is injection-molded out of two different thermoplastic components, so that, upon completion of the injection-molding process, the surface of the body consists of adjacent areas of each of these two components. The thermoplastic components used differ with respect to the ease with which they can be metallized. Components which can be metallized include polyamides of the group PA 6, PA 6.6, or PA 6.6/6; acrylonitrile-butadiene-styrene (ABS); polyoxymethylene (POM); liquid crystal polymers (LCP); polyetherimide (PEI); polyethersulfone (PES); polypropylene (PP); and polycarbonate (PC). Glass fibers can be added to the plastic. Components which are disclosed as being unmetallized or metallizable only with difficulty include especially polymers with a high resistance to chemical pretreatment. Here polyamides of the group PA 6, PA 66, carbon black-filled types of PA, PA 11, PA 12, and types of PPA and PA with a filler content of >50% are used. After the injection-molding process, the part is subjected to a chemical pretreatment, which attacks or changes the two selected components on the surface of the part to different degrees. Through the use of the different plastic components, therefore, different degrees of roughening or different surface structures are produced. A greater degree of roughening or a greater change in the surface of the metallizable component is desirable, because it improves or increases the adhesion of the metal layer during the following metallizing process. At least part of the thickness of a metal layer is formed by purely chemical deposition in an immersion bath.

From the article "Selective Metallizing of LCPs" (in the journal *MO [Metalloberfläche]*), Carl Hanser Verlag, Munich, Vol. 53, No. 3, pp. 20–22, 1999), it is known that LCPs (liquid-crystal polymers) can be metallized to make MID parts (molded interconnect devices). Various production methods for MID parts are described, which are formed out of two different types of plastic, combined into a single part. One of the two types of plastic can be metallized. A type of LCP which shows improved selectivity during metallization of two-component injection-molded parts is also disclosed, which, in addition to a mineral filler content of about 40%, contains approximately 50–100 ppm of palladium as a catalyst for electroless plating. To prepare the palladium-containing LCP for metallizing, it is etched with an alkaline solution and then copper is chemically deposited onto the prepared surface, which is then covered with additional layers.

SUMMARY AND DESCRIPTION OF THE INVENTION

The object of the present invention is to produce an injection-molded plastic part consisting of a first and a second thermoplastic component, where one of the components can be metallized with high selectivity during a metallization process.

The problem is solved in that the second thermoplastic component is a syndiotactic polystyrene (sPS).

The combination of LCP and sPS is especially advantageous, because they have very similar physical properties with respect to processability and shrinkage during cooling in the injection-molding process. Thus, a firm bond with good contact between the components can be achieved. The chemical properties of the LCP and sPS, however, differ advantageously. Whereas LCP is easily attacked chemically by alkaline solutions, for example, and can then be easily metallized, sPS is highly resistant to attack by alkaline solutions. In this case, it is also possible to use, for example, a fiber-reinforced sPS, such as a glass-fiber reinforced sPS.

A particular advantage of the injection-molded plastic part according to the invention is that, because of the high selectivity of this combination of plastics, the LCP and the sPS can be produced in the form of very thin adjacent paths on the surface of the injection-molded plastic part. In the case of conventional injection-molded plastic parts made from two different types of LCP, for example, the minimum width of the paths which can be used is 250 $\mu$m, because paths any narrower that this can no longer be metallized precisely when one of the components is metallized. That is, the metallization bleeds over onto the adjacent component, which is not supposed to be metallized, and thus, in the worst case, short-circuits can be created between the paths. When a combination of sPS and LCP is used, however, paths with a width of only about 200 $\mu$m can be used. In consideration of the demand for the greatest possible degree of miniaturization of these types of injection-molded plastic parts and of the paths present on them, an advantageous decrease in width of about 20% is therefore obtained without detriment to the precision of the metalization applied to the LCP.

An LCP which contains $\geq 20$ ppm to $\leq 500$ ppm of palladium as a catalyst can be metallized especially effectively. Fiber-reinforced LCP types or those with a mineral filler are also highly suitable. Glass fibers or even carbon fibers, for example, can be used for the fiber reinforcement.

The surface of the injection-molded plastic part should preferably be subjected to alkaline etching to produce or to increase the metallizability and selectivity of the corresponding type of LCP for the addition of the metal layer. If the injection-molded plastic part is to be used as a circuit carrier, the surface of the injection-molded plastic part will be metallized where the LCP is exposed. Etching the LCP with an alkaline solution such as aqueous sodium hydroxide roughens the surface of the LCP, and, depending on the etching time and the etching temperature, erodes a greater or lesser amount of surface material, whereas the sPS is not eroded or roughened but rather retains its original edges with great precision. The use of 10–15 N sodium hydroxide, an etching temperature of 60–90° C., and an etching time of 5–60 minutes is favorable. Thus, the etching treatment can produce rough surfaces and/or "trenches" in the areas of the surface of the injection-molded plastic part where the LCP is present. At the same time, the edges of the sPS areas on the part remain sharply defined. After the etching treatment, the LCP can be metallized with excellent accuracy, that is, with clear definition looking down at an angle of 90° to the LCP surface, in that the rough areas are coated and/or the trenches partially or completely filled with metal. The freshly etched LCP surfaces are preferably chemically metallized with metal first, i.e., by electroless plating.

The LCP is preferably electroless plated first with copper, then the copper is covered with additional metal layers or sequences of layers such as layers of nickel, gold, and tin. These layers or sequences of layers can be deposited either with or without an external source of current.

Vectra® E820i Pd, a type of LCP from Ticona GmbH, and the syndiotactic polystyrene Xarec® C 132 from Idemitsu Petrochemical Co. have proven to be especially suitable as a combination of thermoplastic components.

The production of an injection molded plastic art using syndiotactic polystyrene as a first thermoplastic component and of an LCP as a second thermoplastic component according to the invention, where at least areas of the first thermoplastic component are present on the surface of the injection-molded plastic part adjacent to areas of the second thermoplastic component, is ideal, especially when the injection-molded plastic part is a MID part.

BRIEF DESCRIPTION OF THE DRAWINGS

Example 1 and FIGS. 1–6 are intended to explain the invention on an exemplary basis.

EXAMPLE 1

As the first thermoplastic component, a type of LCP with palladium and glass fiber reinforcement was selected (e.g., Vectra® E820i Pd from Ticona GmbH). As the second thermoplastic component, a syndiotactic polystyrene (sPS) was used (e.g., Xarec® C 132 from Idemitsu Petrochemical Co.). The two thermoplastic components were linked together in a 3-dimensional manner by injection molding. The resulting injection-molded plastic part (see FIGS. 1 and 2) was then etched in 12 N sodium hydroxide for 20 minutes at an etching temperature of 80° C. (see FIGS. 3 and 4) and then electroless plated with copper in a copper bath at a temperature of 52° C. for 45 minutes (see FIGS. 5 and 6). The thickness of the copper layer can be adjusted by controlling the plating time. Then the copper layer was electroplated with nickel, and the nickel layer was electroplated with gold to finish the surface.

Figure 1:
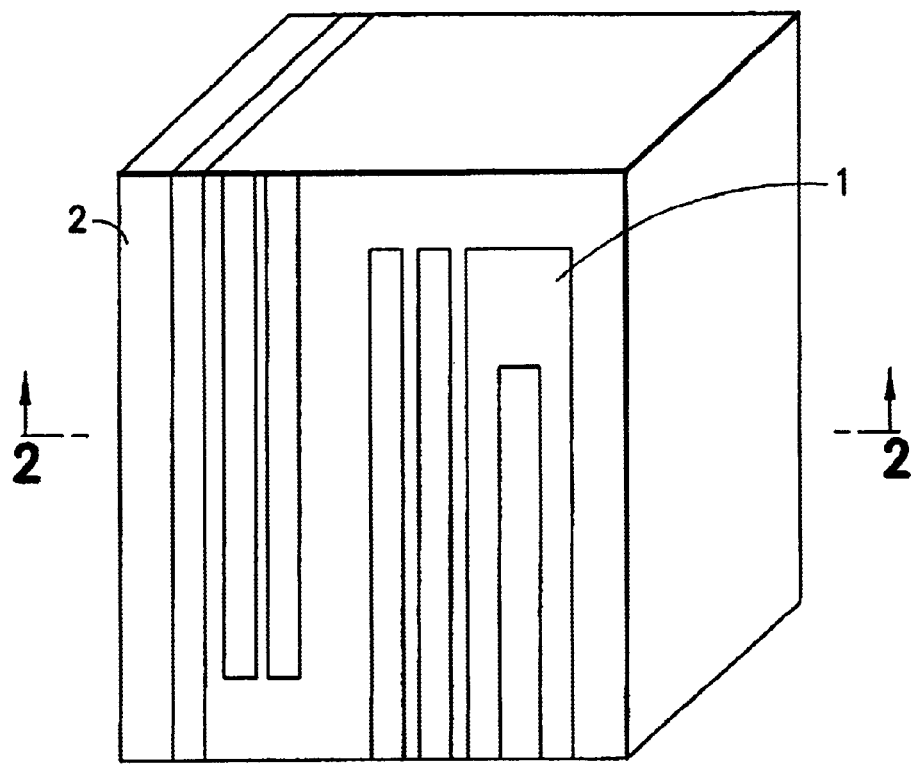
FIG. 1 is a perspective view of an injection-molded plastic part pursuant to the present invention.

FIG. 1 is a 3-dimensional view of an injection-molded plastic part according to the invention as produced according to Example 1. The first thermoplastic component 1, which is an LCP, is integrated in the form of thin paths into the second thermoplastic component 2, which is an sPS.

Figure 2:
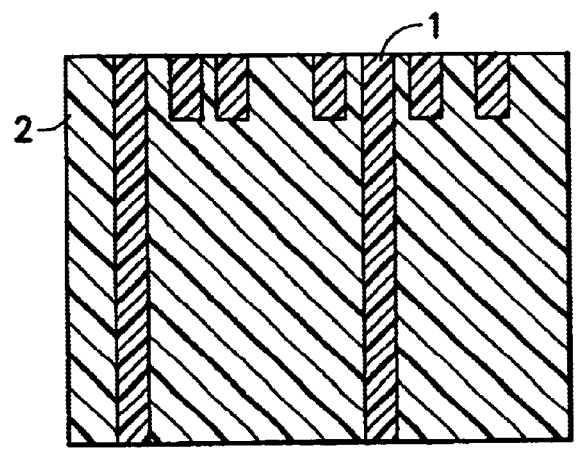
FIG. 2 is a section along line II—II in FIG. 1.

FIG. 2 is a sectional view II—II of the injection-molded plastic part of FIG. 1.

Figure 3:
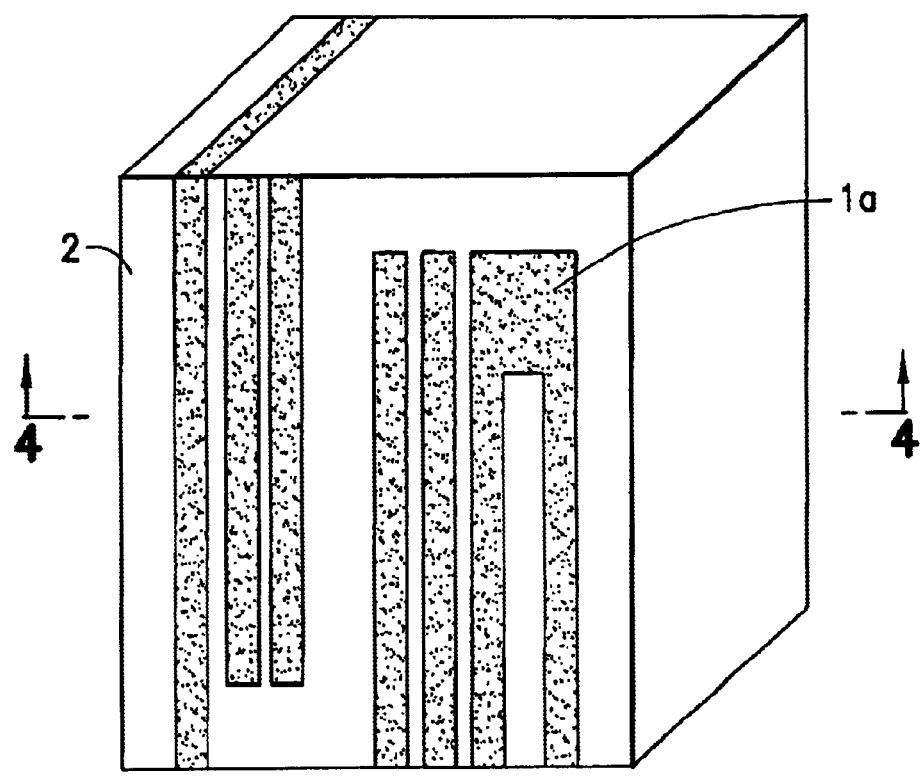
FIG. 3 is a view as in FIG. 1 after chemical treatment.

FIG. 3 is the injection-molded plastic part of FIG. 1 after treatment with 12 N sodium hydroxide. The surface 1a of the first thermoplastic component 1 was roughened and/or eroded to some extent to form trenches, whereas the surface and form of the second thermoplastic component 2 were not changed.

Figure 4:
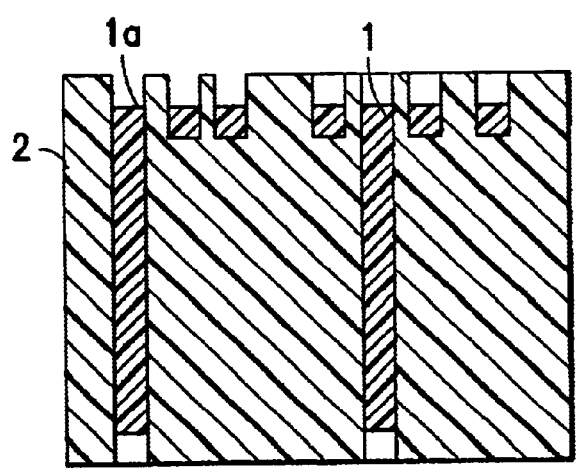
FIG. 4 is a section along line IV—IV in FIG. 3.

FIG. 4 is a sectional view IV—IV of the injection-molded plastic part of FIG. 3, where the erosion of the first thermoplastic component 1 is clearly visible.

Figure 5:
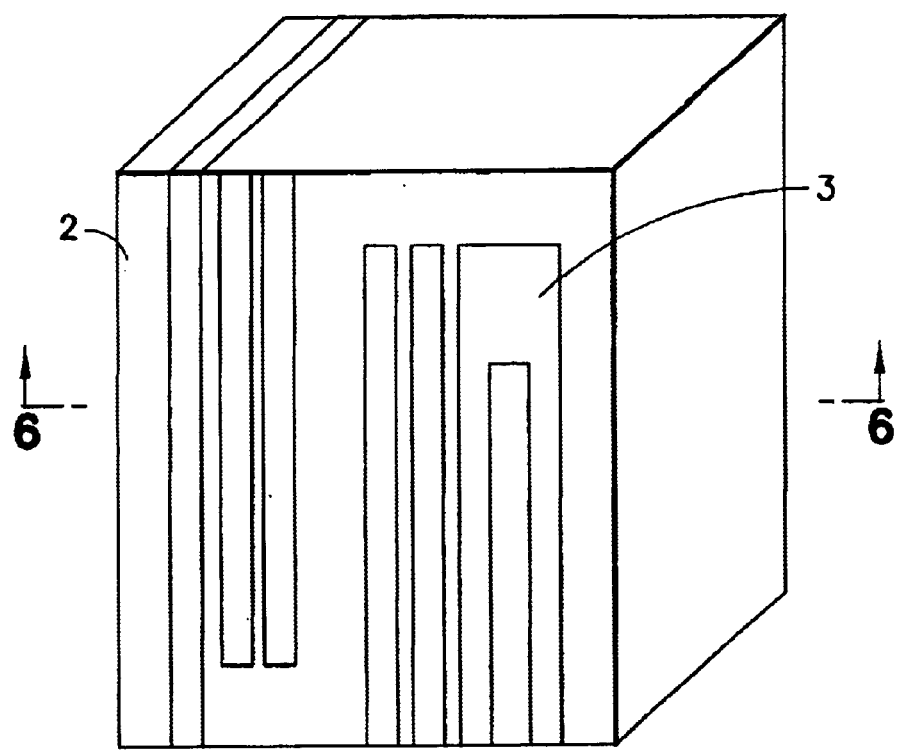
FIG. 5 is a view as in FIG. 3 after metallization.

FIG. 5 shows the injection-molded plastic part of FIG. 3 after the plating process. The surface of the first thermoplastic component 1 was plated, whereas the surface of the second thermoplastic component 2 was not plated. As a result of the plating, conductive strips 3 are formed, which can be used to establish electrical connections.

Figure 6:
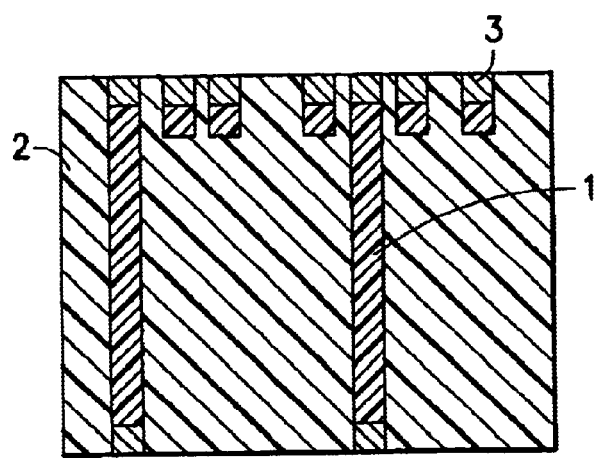
FIG. 6 is a view along line VI—VI in FIG. 5

FIG. 6 is a sectional view VI—VI of the injection-molded plastic part of FIG. 5. The metal which has been deposited in the direction perpendicular to the surface of the first thermoplastic component 1 can be seen in the trenches shown in FIG. 4. It is also possible for the trenches to be only partially filled.

Thus, while there have been shown and described and pointed out fundamental novel features of the present invention as applied to a preferred embodiment thereof, it will be understood that various omissions and substitutions and changes in the form and details of the devices illustrated, and in their operation, may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

We claim:

1. An injection-molded plastic part, comprising: a first thermoplastic component; and a second thermoplastic component, areas of the first thermoplastic component are present at least on one surface of the injection-molded plastic part next to areas of the second thermoplastic component, the first thermoplastic component being a liquid crystal polymer (LCP), and the second thermoplastic component is a syndiotactic polystyrene, the LCP contains >20 ppm to <500 ppm of palladium as a catalyst.

2. An injection-molded plastic part according to claim 1, wherein the LCP is fiber-reinforced.

3. An injection-molded plastic part according to claim 1, wherein the LCP has a mineral filler.

4. An injection-molded part according to claim 1, wherein the at least one surface of the injection-molded plastic part is an alkaline etched surface.

5. An injection-molded plastic art to claim 1, wherein the at least one surface of the injection-molded plastic is metal-plated in areas where the LCP is present.

6. An injection-molded part according to claim 5, wherein the LCP is plated with copper.

7. An injection-molded plastic part according to claim 6, wherein the copper is overplated with additional metal layers.

8. An injection-molded plastic part, comprising: a first thermoplastic component; and a second thermoplastic component, areas of the first thermoplastic component are present at least on one surface of the injection-molded plastic part next to areas of the second thermoplastic component, the first thermoplastic component being a liquid crystal polymer (LCP), and the second thermoplastic component is a syndiotactic polystyrene, the at least one surface of the injection-molded plastic part being metal-plated in areas where the LCP is present.

9. An injection-molded plastic part according to claim 8, wherein the LCP contains >20 ppm to <500 ppm of palladium as a catalyst.

10. An injection-molded plastic part according to claim 8, wherein the LCP is fiber-reinforced.

11. An injection-molded plastic part according to claim 8, wherein the LCP has a mineral filler.

12. An injection-molded part according to claim 8, wherein the at least one surface of the injection-molded plastic part is an alkaline etched surface.

13. An injection-molded part according to claim 8, wherein the LCP is plated with copper.

14. An injection-molded plastic part according to claim 13, wherein the copper is overplated with additional metal layers.

15. A process for producing an injection-molded plastic part, comprising molding the part to have a first syndiotactic polystyrene component and a second liquid crystal polymer component so that areas of the first component are present on at least one surface of the injection-molded plastic part next to areas of the second component.

16. A process according to claim 15, wherein the injection-molded plastic part is a Molded Interconnect Device part.

* * * * *